US011289532B1

(12) United States Patent
Piccione et al.

(10) Patent No.: US 11,289,532 B1
(45) Date of Patent: Mar. 29, 2022

(54) SYSTEMS, METHODS, AND DEVICES FOR REDUCING OPTICAL AND ELECTRICAL CROSSTALK IN PHOTODIODES

(71) Applicant: Argo AI, LLC, Pittsburgh, PA (US)

(72) Inventors: Brian Piccione, Yardley, PA (US);
Mark Itzler, Princeton, NJ (US);
Xudong Jiang, Princeton, NJ (US);
Krystyna Slomkowski, Parlin, NJ (US); Harold Y. Hwang, Plainsboro, NJ (US); John L. Hostetler, Highstown, NJ (US)

(73) Assignee: Argo AI, LLC, Pittsburgh, PA (US)

( * ) Notice: Subject to any disclaimer, the term of this patent is extended or adjusted under 35 U.S.C. 154(b) by 16 days.

(21) Appl. No.: 17/014,666

(22) Filed: Sep. 8, 2020

(51) Int. Cl.
*H01L 27/14* (2006.01)
*H01L 27/146* (2006.01)

(52) U.S. Cl.
CPC .... *H01L 27/14665* (2013.01); *H01L 27/1463* (2013.01); *H01L 27/14685* (2013.01); *H01L 27/14694* (2013.01)

(58) Field of Classification Search
CPC ........... H01L 27/1463; H01L 27/14665; H01L 27/14685; H01L 27/14694; H01L 31/107; H01L 31/1075
See application file for complete search history.

(56) References Cited

U.S. PATENT DOCUMENTS

| | | | |
|---|---|---|---|
| 7,376,169 B2 | 5/2008 | Henrichs | |
| 7,476,598 B2 | 1/2009 | Son et al. | |
| 7,595,213 B2 | 9/2009 | Kwon et al. | |
| 7,652,257 B2 | 1/2010 | Li et al. | |
| 7,795,064 B2 | 9/2010 | Pan et al. | |
| 7,888,159 B2 | 2/2011 | Venezia et al. | |
| 8,816,464 B2 | 8/2014 | Bui et al. | |
| 9,966,412 B2 | 5/2018 | Lin et al. | |
| 2008/0283953 A1* | 11/2008 | Itzler | H01L 31/107 257/438 |
| 2009/0026494 A1* | 1/2009 | Itzler | H01L 31/107 257/186 |
| 2014/0239361 A1 | 8/2014 | Ma | |
| 2016/0218236 A1 | 7/2016 | Dhulla et al. | |
| 2016/0254407 A1 | 9/2016 | Wang et al. | |
| 2017/0053959 A1 | 2/2017 | Hsieh et al. | |
| 2017/0084773 A1 | 3/2017 | Piccione et al. | |

* cited by examiner

*Primary Examiner* — Kevin K Pyo
(74) *Attorney, Agent, or Firm* — Sterne, Kessler, Goldstein & Fox P.L.L.C.

(57) ABSTRACT

Devices, systems, and methods are provided for reducing electrical and optical crosstalk in photodiodes. A photodiode may include a first layer with passive material, the passive material having no electric field. The photodiode may include a second layer with an absorbing material, the second layer above the first layer. The photodiode may include a diffused region with a buried p-n junction. The photodiode may include an active region with the buried p-n junction and having an electric field greater than zero. The photodiode may include a plateau structure based on etching through the second layer to the first layer, the etching performed at a distance of fifteen microns or less from the buried p-n junction.

18 Claims, 12 Drawing Sheets

US 11,289,532 B1

SYSTEMS, METHODS, AND DEVICES FOR REDUCING OPTICAL AND ELECTRICAL CROSSTALK IN PHOTODIODES

TECHNICAL FIELD

This disclosure generally relates to limiting crosstalk in photodiode devices.

BACKGROUND

Semiconductors increasingly are being used for various applications. Some applications use multiple semiconductors in close proximity to one another. The operation of semiconductors, such as photodiodes, may result in electrical and/or optical crosstalk between photodiode pixels. The crosstalk may be a source of noise that may increase as pixel pitch decreases. Fabrication of photodiodes to reduce crosstalk may be inefficient due to a need for electrical passivation of materials with significant electric fields, and due to a risk of noise resulting from some material used to facilitate electrical passivation. There is a need for an efficient design of low-noise photodiodes with small pixel pitch.

Figure 1A:
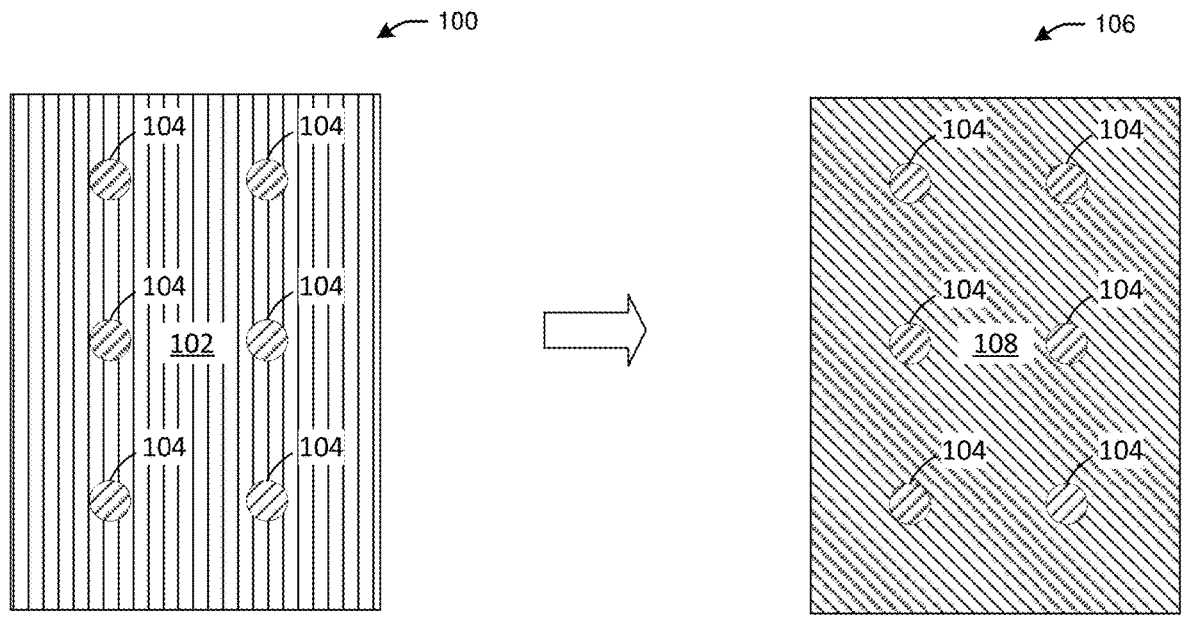
FIG. 1A illustrates example photodiode structures, in accordance with one or more example embodiments of the present disclosure.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Example embodiments described herein provide certain systems, methods, and devices for reducing electrical and optical crosstalk in photodiodes.

Photodiodes are semiconductor devices that may convert light into electrical current. Photodiodes may be elements of sensors, and may be arranged in an array in which pixels of the photodiode array may have a p-n junction. A p-n junction may be formed when p-type and n-type materials are arranged in contact with each other. Current may flow from one type of material to the other to create a diode.

Buried p-n junctions may be used in photodiodes, such as in avalanche photodiodes (APDs), which may refer to photodiodes that may generate large electrical current signals in response to receiving a low-powered optical signal. An APD may be biased by applying a voltage across the APD, resulting in a significant (e.g., non-zero) electrical field. Free electrical carriers may be generated in an absorption layer of the APD and injected into a multiplication region (e.g., avalanche region) of the APD. The absorption layer may absorb energy from light to generate free charge carriers. The multiplication layer may be a region of the APD in which the free charge carriers multiply to generate detectable electrical current. The free carriers may accelerate in the multiplication layer, allowing them to create additional free carriers (e.g., a process referred to as "impact ionization"), and the additional free carriers also may accelerate (e.g., due to the electric field presence) to create more free carriers. This multiplication of free carriers may be referred to as avalanche multiplication. When light enters a photodiode, electron-hole pairs may be generated when the energy from the light exceeds a band gap energy. An electric field may cause the electrons to drift to the n-type material and the holes (e.g., electron holes) to drift to the p-type material. The stronger the electric field, the more drift of the electrons and holes.

An active material of a photodiode may refer to a material having a finite, non-zero electric field. A non-active or passive material may refer to a material in which no electric field is present (e.g., an electric field of zero). The rate at which an electric field decreases (e.g., to zero) from an active region to a passive region may depend on the doping used. For example, an electrical field of one photodiode may drop off at a distance closer to a diffused region than in another photodiode because of the doping used in the photodiodes.

The use of buried p-n junctions in a photodiode may facilitate electrical passivation, but may result in a remaining presence of an absorber material that may contribute to increased noise associated with crosstalk effects. A non-zero electric field (e.g., caused by an applied voltage across a photodiode) may be present in at least a portion of absorber material. For example, the absorber material may at least partially surround an active p-n junction. The further away from the active p-n junction, the weaker the electric field of the absorber material may be.

Some photodiodes use a "mesa" structure to create an active region. A mesa structure on a semiconductor may refer to an area where material of the semiconductor has not been removed (e.g., etched away), resulting in a flat-topped surface that rises above a surrounding semiconductor substrate. Mesa structures for semiconductors may be formed by etching away non-active material and leaving active material for the mesa with non-planar passivation. To reduce crosstalk, non-active absorber material may be etched away because the non-active material may contribute to crosstalk between photodiode pixels. The crosstalk may be a source of noise that increases rapidly with decreasing pixel pitch (e.g., the density of pixels in a cluster of photodiode array pixels). Mesa formation, however, may require electrical passivation of surfaces having high electric fields, resulting in fabrication challenges and inefficiencies. For example, forming a mesa structure by etching into an active region where the electric field strength is greater than zero or etching into an inactive region too close to the active region may require passivation of material even though crosstalk may be reduced by removing some of the material.

Therefore, there is a need to design a low-noise photodiode array with small pixel pitch.

In one or more embodiments, the use of a mesa structure may be combined with a buried p-n junction to form a photodiode array with reduced crosstalk and noise. The photodiode array may be formed by removing absorber material from a device having a buried p-n junction to mitigate crosstalk while maintaining high-quality passivation. For example, the more material etched away or otherwise removed, the more crosstalk may be reduced. However, the removal of absorber material further away from an active region may result in the remaining absorber material being within the active region and having a non-zero electric field, or being in close proximity to material having a non-zero electric field, thereby necessitating passivation. The surface electric field intensities may be reduced and may be tuned by adjusting the distance between the active absorber material and the removed absorber material. Removal of absorber material may be achieved using geometric configurations such as trenches, pits, end caps, wells, and troughs as described further herein, and may allow for a significant reduction in the dark carrier generation, which manifests as dark current in a linear-mode APD or as the dark count rate (e.g. the average rate of counts without incident light) of a single-photon avalanche diode. An active region of the photodiode array may be formed by etching away at least a portion of the absorber region to form a mesa structure with non-planar passivation, and the active region may be formed by dopant diffusion to create a buried p-n junction with planar passivation. To optimize passivation by avoiding a need to passivate material with a high electric field, at least some absorber material around the active p-n junction may not be removed by etching. Etching further away from the p-n junction and leaving more absorber material may result in significant crosstalk, but etching closer to the p-n junction and leaving less (if any) absorber material may result in a need to passivate material having significant electric field strength. Therefore, the hybrid use of a mesa structure and a buried p-n junction may balance a goal of reducing crosstalk by etching absorber material with a goal of avoiding a need to passivate materials with a significant electric field.

In one or more embodiments, the electric field strength of the photodiode array may be tailored based on the amount of absorber material that is left around the buried p-n junction after etching away some of the absorber material. For example, rather than etching away all of the non-active absorber material around the active material in a photodiode array, passivation may be achieved by leaving some absorber material as a buffer between the exposed portions of active material, but not so much absorber material that significant crosstalk results. The optimized amount of etching may answer a question of how far into or how close to the active region to etch in order to minimize both passivation and crosstalk. The distance from the diffused region at which absorber material may be etched may be dependent on the electric field strength at the distance, and based on any need to passivate any material that remains after etching.

In some focal plane arrays, carrier diffusion time constants may have relaxed requirements. For example, for some InGaAs PIN detectors (e.g., un-doped detectors) operating at video rates (e.g., 24-60 Hz), collection times for free carriers may be on the order of microseconds or milliseconds. In such cases, no absorber material needs to be removed from a photodiode array, and all of the absorber material in a pixel area of the photodiode array may contribute to the overall fill factor when the pixel dimension is on the order of a minority carrier diffusion length. In contrast, for applications requiring faster time constants, there may be drawbacks to leaving absorber material within an effective pixel because the absorber material may have slow time constants for carrier collection. Light detection and ranging (LIDAR) applications are among applications that may require fast time constants. Telecommunications also may require fast time constants, and may require high linearity. For example, analogue telecommunications receivers may experience significant waveform distortion with slow time constants.

To address the need for fast time constants in some applications, an optical use may ensure that no photons reach the non-active (i.e. field-free) absorber material of a photodiode array. However, when photons are generated within a semiconductor itself, it may not be feasible to ensure that the photons do not reach the absorber material. Such "crosstalk" photons generated during a very large avalanche detection event may be absorbed directly in a neighboring pixel active region (e.g., "optical crosstalk") or absorbed in a non-active region where the generated electrical carriers may diffuse to a neighboring active region (e.g., "diffusive crosstalk"). This issue may be a problem for applications requiring fast time constants. For example, an InGaAs absorber material may have long carrier diffusion lengths (e.g., 50-200 um) and lifetimes (e.g., 1-100 us). Because carriers may be long-lived and may diffuse relatively long distances, the carriers may migrate long distances outside of the active regions of the photodiode array to be collected and trigger dark counts at hundreds of nanoseconds or microseconds later, giving rise to false detection events much later than the time corresponding to the actual arrivals of signal photons.

In one or more embodiments, a photodiode array may include pits, trenches, end caps, and/or troughs. For example, an avalanche photodiode array may include multiple layers of materials, such as a buffer layer, an absorber layer above the buffer layer, active and multiplication/avalanche regions above the absorber layer, and troughs etched from the active region to the buffer layer. The troughs may allow for a portion of the top surface of the absorber layer to be exposed and for a portion of the buffer to be exposed, forming a mesa structure in which the active material forms the top of the mesa, with some absorber material left around the active material, and some absorber material etched away to form the mesa with part of the buffer exposed at a lower level. The photodiode array may have multiple active regions surrounded by absorber material, and some absorber material etched away to expose the buffer layer and form a mesa structure. The active material may include a buried p-n junction to leverage the electrical passivation facilitated by the buried p-n junction, and some of the noisy absorber material may be etched away from around the buried p-n junction to reduce crosstalk.

In one or more embodiments, a hybrid design of photodiode arrays that uses both buried p-n junctions and an etched mesa structure may support Geiger-mode operations. In Geiger-mode operations, APDs in an array may be biased above a breakdown voltage to allow a photon to trigger an avalanche.

The above descriptions are for purposes of illustration and are not meant to be limiting. Numerous other examples, configurations, processes, etc., may exist, some of which are described in greater detail below. Example embodiments will now be described with reference to the accompanying figures.

FIG. 1A illustrates example photodiode structures, in accordance with one or more example embodiments of the present disclosure.

Referring to FIG. 1A, a photodiode structure 100 is shown two-dimensionally from a top view. The photodiode structure 100 may be a planar-diffused structure with a non-active material 102 (e.g. material having zero electric field strength) surrounding active material 104 (e.g., material having non-zero electric field strength). The non-active material 102 may be removed (e.g., etched away) to form a photodiode structure 106 (e.g., shown from a top view). The photodiode structure 106 may include the active material 104 of the photodiode structure 100, along with a buffer layer 108 (e.g., exposed by removing the entirety of the non-active material 102 from the photodiode structure 100). The photodiode structure 106 therefore may include no non-active absorber material surrounding the active material 104, so the photodiode structure 106 may require significant passivation of the active material 104.

Figure 1B:
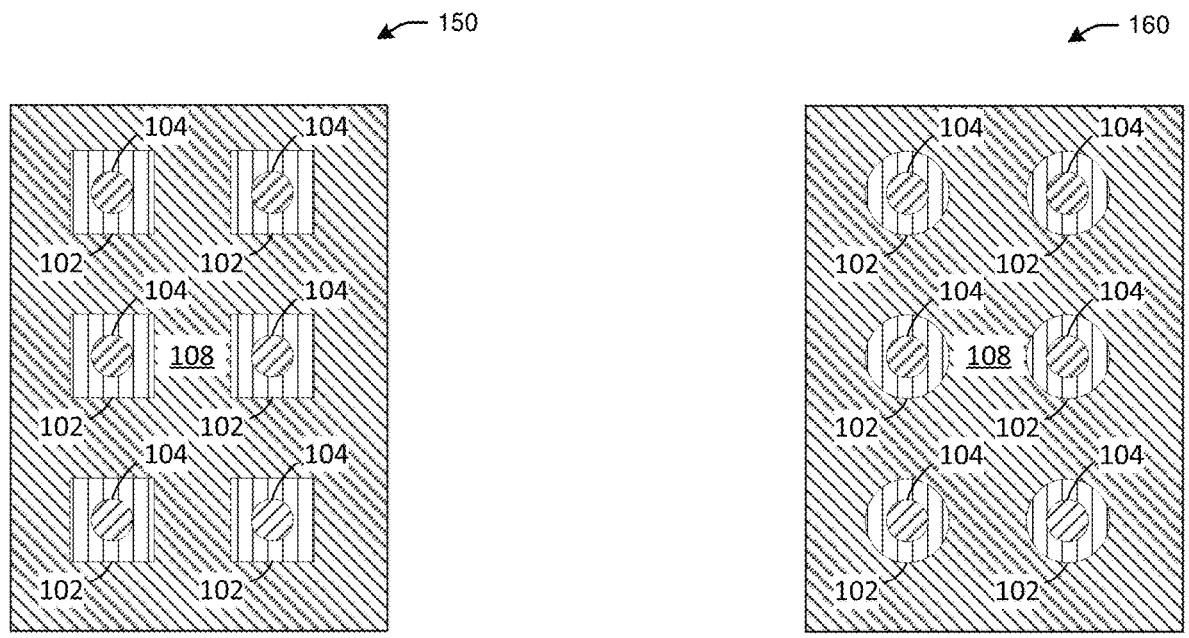
FIG. 1B illustrates example photodiode structures, in accordance with one or more example embodiments of the present disclosure.

Referring to FIG. 1B, a photodiode structure 150 is shown two-dimensionally from a top view. The photodiode structure 150 may be a planar-diffused structure with the non-active material 102 (e.g. material having zero electric field strength) surrounding the active material 104 (e.g., material having non-zero electric field strength). Unlike the photodiode structure 106 of FIG. 1A, some of the non-active material 102 may remain after etching. The buffer layer 108 may be exposed where portions of the non-active material 102 have been removed. In the photodiode structure 150, the non-active material 102 forms a rectangular region around the active material 104. In this manner, the remaining non-active material 102 after etching may result in an area with zero electric field, thereby avoiding a difficult process of passivating material having a high electric field strength.

Still referring to FIG. 1B, a photodiode structure 160 is shown two-dimensionally from a top view. The photodiode structure 160 may be a planar-diffused structure with the non-active material 102 (e.g. material having zero electric field strength) surrounding the active material 104 (e.g., material having non-zero electric field strength). Unlike the photodiode structure 106 of FIG. 1A, some of the non-active material 102 may remain after etching. The buffer layer 108 may be exposed where portions of the non-active material 102 have been removed. In the photodiode structure 160, the non-active material 102 forms a circular region around the active material 104. In this manner, the remaining non-active material 102 after etching may result in an area with zero electric field, thereby avoiding a difficult process of passivating material having a high electric field strength.

Referring to FIG. 1A and FIG. 1B, the removal of at least a portion of the non-active material 102 may result in a mesa structure. As shown in FIG. 1B, the active material 104 may be formed by using a buried p-n junction, which may be above the buffer layer 108. The buffer layer 108 with a higher layer formed by the active material 104 may result in a mesa structure with a p-n junction. The photodiode structure 150 and the photodiode structure 160 may refer to APDs with an array of photodiodes.

Figure 1C:
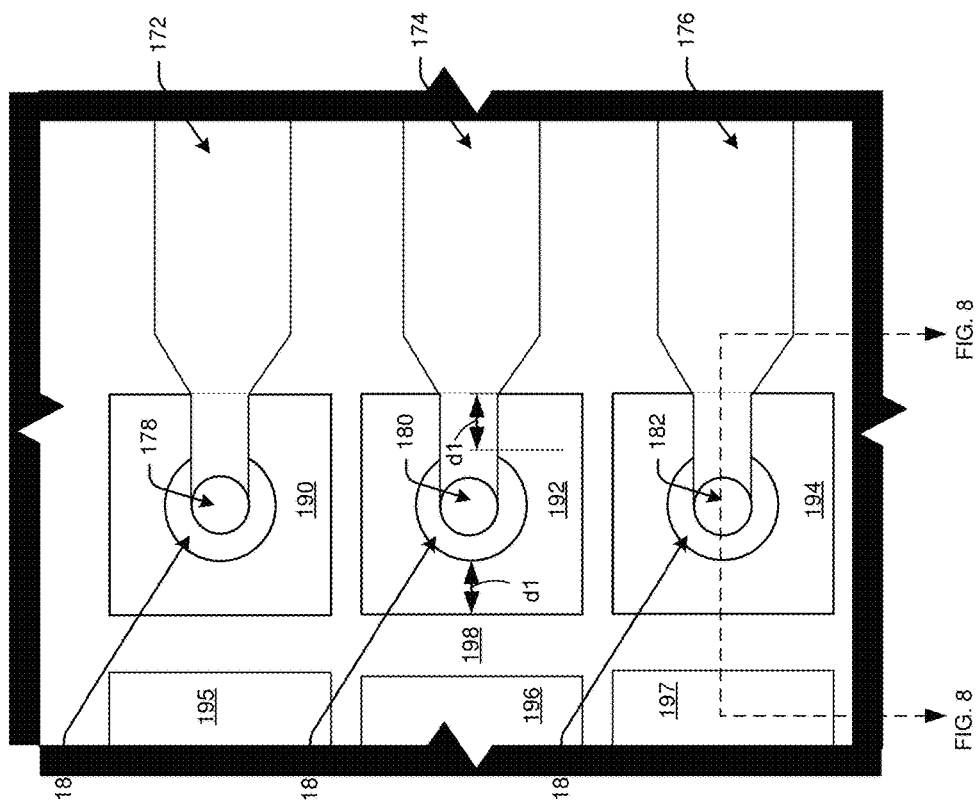
FIG. 1C illustrates a portion of photodiode structures, in accordance with one or more example embodiments of the present disclosure.

FIG. 1C illustrates a portion 170 of photodiode structures, in accordance with one or more example embodiments of the present disclosure.

Referring to FIG. 1C, the portion 170 may be similar to the photodiode structure 150. For example, the portion 170 may have electrical traces (e.g., trace 172, trace 174, trace 176) with anode contact points (e.g., contact point 178 of the trace 172, contact point 180 of the trace 174, contact point 182 of the trace 176). The anode contact points may be positioned within respective diffused regions (e.g., the contact point 178 may be positioned within diffused region 184; the contact point 180 may be positioned within the diffused region 186; and the contact point 182 may be positioned within diffused region 188). The diffused regions may refer to multiplication/avalanche regions where avalanching may occur. Plateaus (e.g., plateau 190, plateau 192, plateau 194, plateau 195, plateau 196, and plateau 197) may be created by removal (e.g., etching) of material, resulting in the formation of trenches (e.g., trench 198) between the plateaus (e.g., the trench 198 may be further into the page than the plateaus).

Where the trench 198 is etched, and therefore where the plateaus are formed relative to the diffused regions, represents a selection of the distance d1 (e.g., a distance between the diffused region 186 and the trench 198) to minimize crosstalk and optimize electrical passivation. For example, the smaller the distance d1, the more likely the electrical field where the trench 198 is formed may be greater than zero, therefore requiring more significant electrical passivation. The larger the distance d1, the more likely the electrical field where the trench 198 is formed may be zero. In this manner, the distance d1 is a factor in the electrical field strength of the sides of the plateaus formed by the etching that results in the trench 198.

Figure 8:
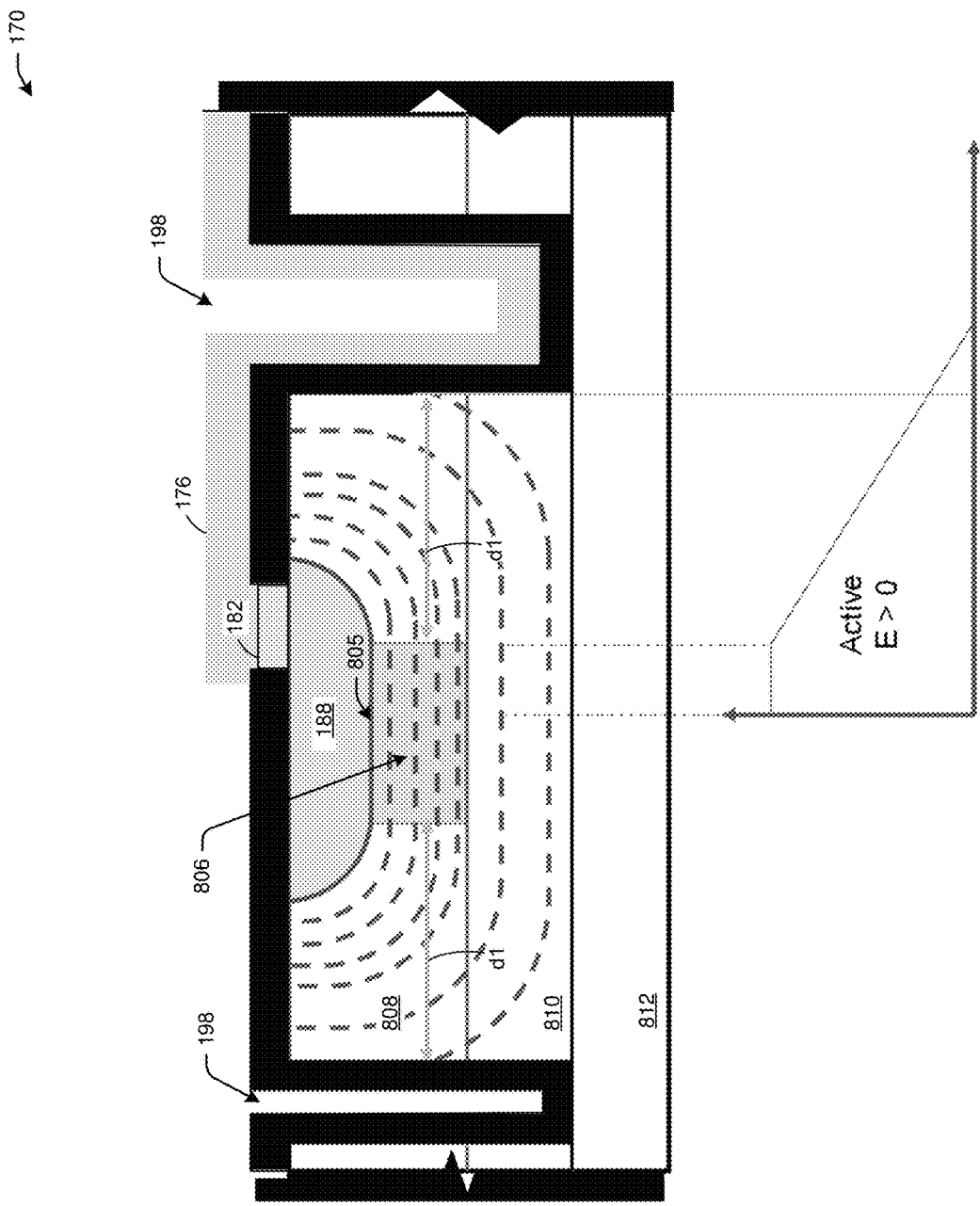
FIG. 8 illustrates an example side cross-section view of the portion of the photodiode structures of FIG. 1C, in accordance with one or more example embodiments of the present disclosure.

The cross-section lines are the basis for FIG. 8.

Figure 2:
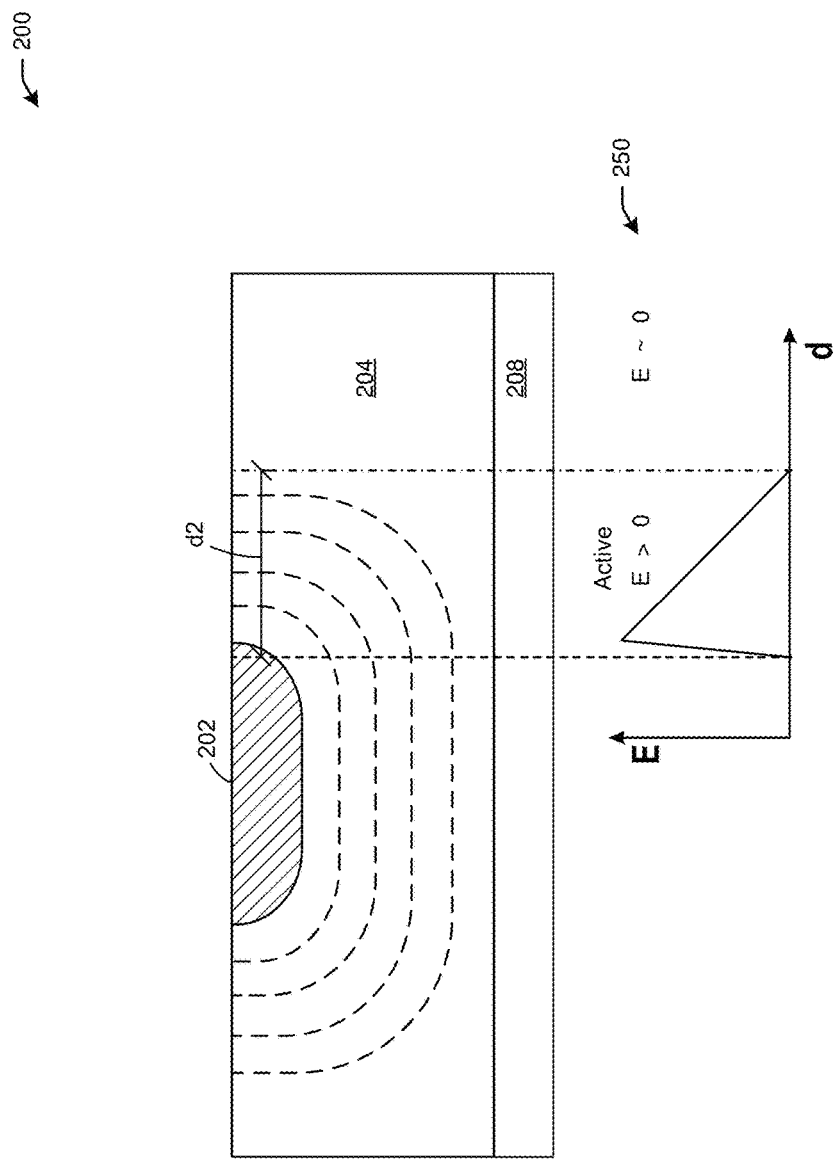
FIG. 2 illustrates an example homojunction p-n photodiode, in accordance with one or more example embodiments of the present disclosure.

FIG. 2 illustrates an example homojunction p-n photodiode 200, in accordance with one or more example embodiments of the present disclosure.

Referring to FIG. 2, the homojunction p-n photodiode 200 may include a p-diffused region 202 at least partially positioned within an n-absorber layer 204. The n-absorber layer 204 may be positioned on a buffer layer 208. Where the homojunction p-n photodiode 200 is active (e.g., exhibits an electric field E>0) may depend a distance d1 from the p-diffused region 202. As shown by a graph 250, the electric field E of the homojunction p-n photodiode 200 may be active up until a distance d2, and then inactive beyond the distance d2. In this manner, when the n-absorber layer 204 is removed (e.g., etched) at a location within the distance d1 from the p-diffused region 202, the remaining n-absorber layer 204 may be active, and therefore may require passivation. When the n-absorber layer 204 is removed at a location outside of (e.g., greater than) the distance d1 from the p-diffused region 202, the remaining n-absorber layer 204 may be inactive, and therefore may avoid the need for passivation. However, more of the n-absorber layer 204 remaining after etching may result in greater noise due to crosstalk effects. In this manner, the location at which the n-absorber layer 204 may be removed may be a balancing act that maximizes the amount of the n-absorber layer 204 removed to reduce crosstalk effects while minimizing passivation that may be necessitated by removing too much of the n-absorber layer 204 (e.g., such that the remaining n-absorber layer 204 is active). If the n-absorber layer 204 is removed within the active region and exposes a surface with a higher electric field intensity, as indicated by the graph 250, then a higher quality passivation layer will be needed to adequately passivate this exposed active region surface.

Figure 3:
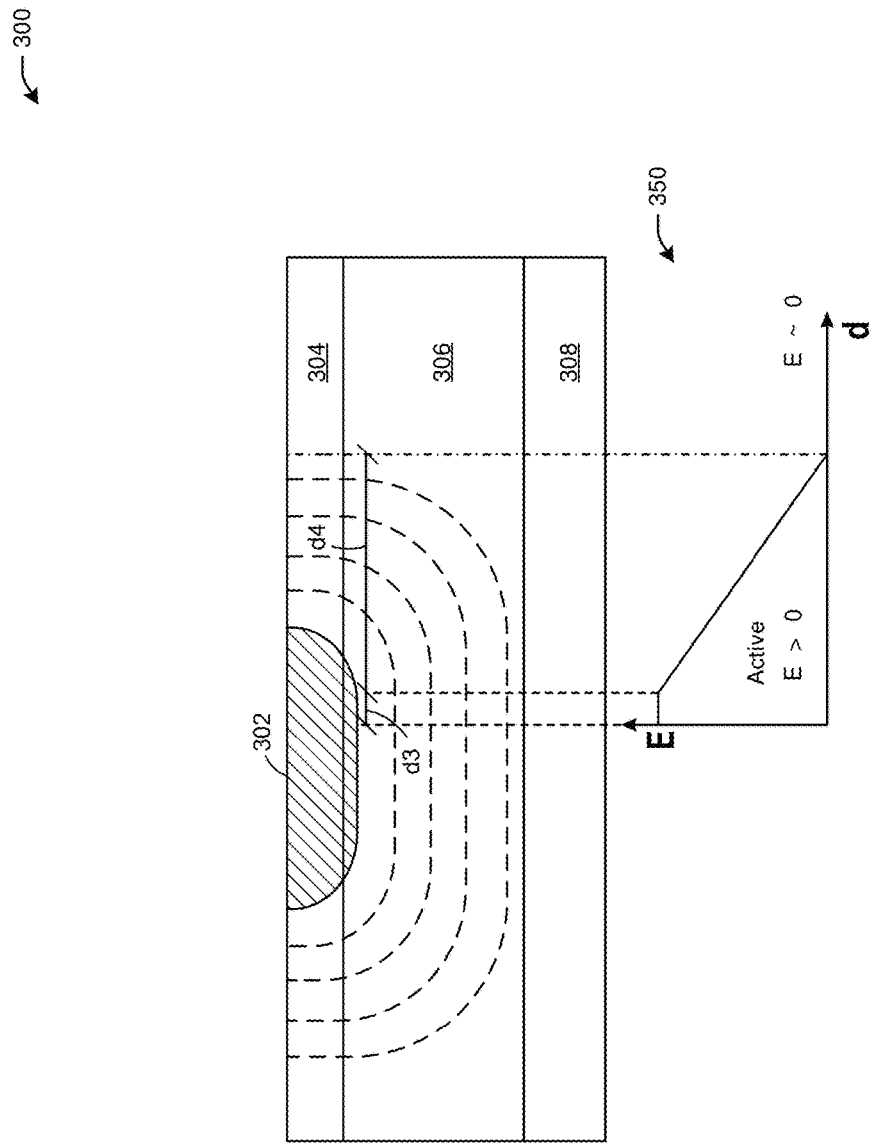
FIG. 3 illustrates an example heterojunction p-i-n photodiode, in accordance with one or more example embodiments of the present disclosure.

FIG. 3 illustrates an example heterojunction p-i-n photodiode 300, in accordance with one or more example embodiments of the present disclosure.

Referring to FIG. 3, the heterojunction p-i-n photodiode 300 may include a p+ diffused region 302 positioned at least partially within a n– cap layer 304 and an n– absorption layer 306 (e.g., which may be positioned below the n– cap layer 304), and a n+ buffer layer 308 positioned below the n– absorption layer 306. Where the heterojunction p-i-n photodiode 300 is active (e.g., exhibits an electric field E>0) may depend a distance d3 and/or the distance d4 from the p+ diffused region 302. As shown by a graph 350, the electric field E of the heterojunction p-i-n photodiode 300 may be constant up until the distance d3, and then the E field may decline from d3 to d4, beyond which the heterojunction p-i-n photodiode 300 may become inactive. In this manner, when the n– cap layer 304 and the n– absorption layer 306 are removed (e.g., etched) at a location within the distance d3 or d4 from the p+ diffused region 302, the remaining n– cap layer 304 and n– absorption layer 306 may be active, and therefore may require passivation. When the n– cap layer 304 and the n– absorption layer 306 are removed at a location outside of (e.g., greater than) the distance d4 from the p+ diffused region 302, the remaining n– cap layer 304 and n-absorption layer 306 may be inactive, and therefore may avoid the need for passivation. However, more of the n– cap layer 304 and n– absorption layer 306 remaining after etching may result in greater noise due to crosstalk effects. In this manner, the location at which the n– cap layer 304 and n– absorption layer 306 may be removed may be a balancing act that maximizes the amount of the n– cap layer 304 and n– absorption layer 306 removed to reduce crosstalk effects while minimizing passivation that may be necessitated by removing too much of the n– cap layer 304 and n– absorption layer 306 (e.g., such that the remaining n– cap layer 304 and n– absorption layer 306 are active).

Figure 4:
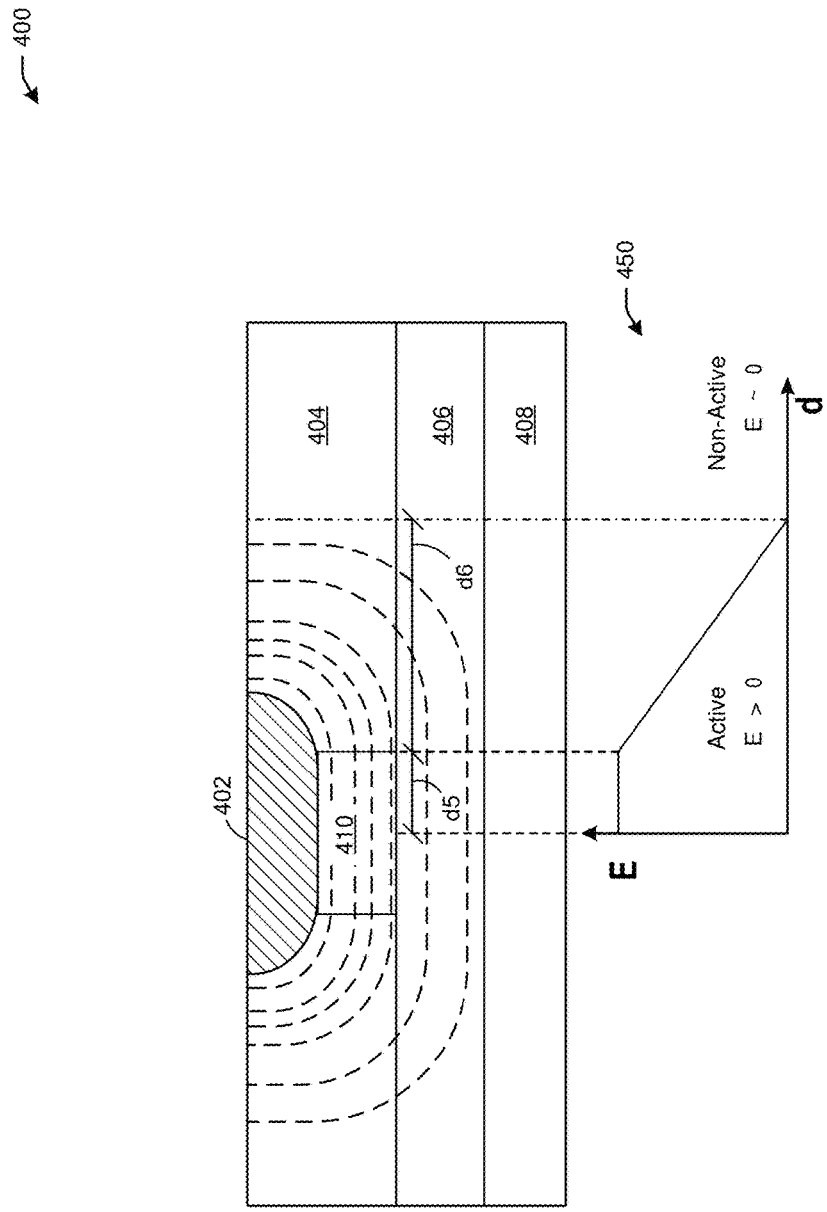
FIG. 4 illustrates an example heterojunction avalanche photodiode, in accordance with one or more example embodiments of the present disclosure.

FIG. 4 illustrates an example heterojunction avalanche photodiode (APD) 400, in accordance with one or more example embodiments of the present disclosure.

Referring to FIG. 4, the heterojunction APD 400 may include a p+ diffused region 402 at least partially positioned within a cap layer 404, and the cap layer 404 may be positioned above an n– absorption layer 406. Below the n– absorption layer 406, the heterojunction APD 400 may include an n+ buffer layer 408. Avalanching may occur within the cap layer 404 (e.g., at a portion 410 of the cap layer 404 proximal enough to the p+ diffused region 402, where the electric field strength may be strong enough to give rise to avalanche gain). The portion 410 of the cap layer 404 may be referred to as an avalanche region, which may extend to the n– absorption layer 406.

Where the heterojunction APD 400 is active (e.g., exhibits an electric field E>0) may depend a distance d5 and/or the distance d6 from the p+ diffused region 402. As shown by a graph 450, the electric field E of the heterojunction APD 400 may be constant up until the distance d5 (e.g., the edge of the avalanche region), and then the E field may decline from d5 to d6, beyond which the heterojunction APD 400 may become inactive. In this manner, when the cap layer 404, the n– absorption layer 406, and the n+ buffer layer 408 are removed (e.g., etched) at a location within the distance d5 or d6 from the p+ diffused region 402, the remaining cap layer 404, n-absorption layer 406, and n+ buffer layer 408 may be active, and therefore may require passivation. When the cap layer 404, the n– absorption layer 406, and the n+ buffer layer 408 are removed at a location outside of (e.g., greater than) the distance d6 from the p+ diffused region 402, the cap layer 404, n– absorption layer 406, and n+ buffer layer 408 may be inactive, and therefore may avoid the need for passivation. However, more of the cap layer 404, n– absorption layer 406, and n+ buffer layer 408 remaining after etching may result in greater noise due to crosstalk effects. In this manner, the location at which the cap layer 404, n– absorption layer 406, and n+ buffer layer 408 may be removed may be a balancing act that maximizes the amount of the cap layer 404, n– absorption layer 406, and n+ buffer layer 408 removed to reduce crosstalk effects while minimizing passivation that may be necessitated by removing too much of the cap layer 404, n– absorption layer 406, and n+ buffer layer 408 (e.g., such that the cap layer 404, n-absorption layer 406, and n+ buffer layer 408 are active). If the n– absorption layer 406 is removed within the active region and exposes a surface with a higher electric field intensity, as indicated by the graph 450, then a higher quality passivation layer will be needed to adequately passivate this exposed active region surface.

Figure 5:
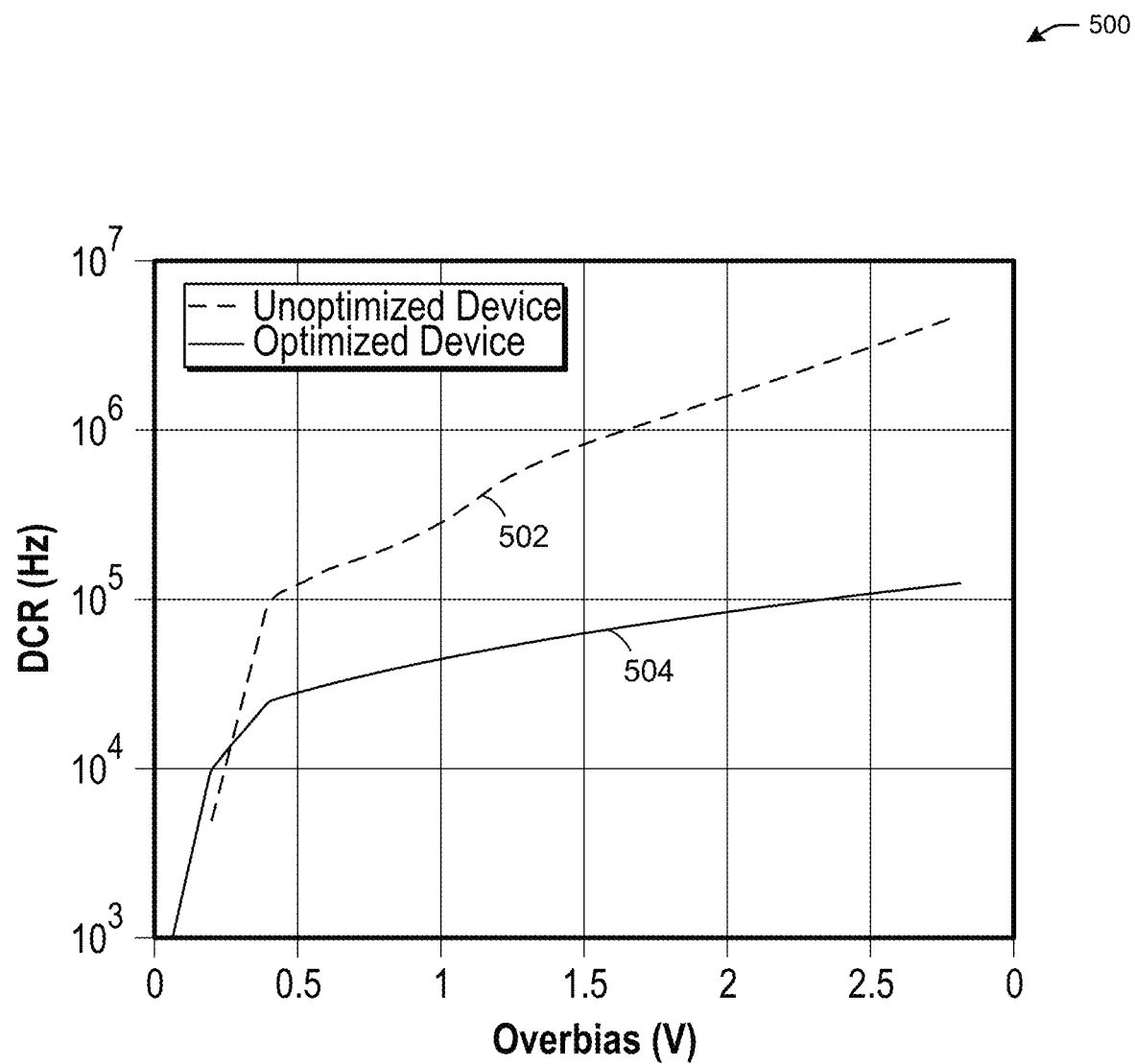
FIG. 5 illustrates a graph showing average dark count rate for photodiode devices, in accordance with one or more example embodiments of the present disclosure.

FIG. 5 illustrates a graph 500 showing average dark count rate for photodiode devices, in accordance with one or more example embodiments of the present disclosure.

Referring to FIG. 5, the dark count rate is shown on the vertical axis with a metric of hertz (Hz), and overbias is shown on the horizontal axis with a metric of volts (V). The dark count rate 502 of an un-optimized device (e.g., a device without the hybrid mesa structure with buried p-n junction and selective removal of non-active material) may experience a significantly higher dark count rate than the dark count rate 504 experienced by an optimized device (e.g., a device using the hybrid mesa structure with buried p-n junction and selective removal of non-active material), such as a device using the photodiode structure 150 or the photodiode structure 160 of FIG. 1B. For example, an optimized device may experience a thirty-time reduction in dark count rate when compared to an un-optimized device. In this manner, the graph 500 shows benefits of using enhanced methods and structures to reduce electrical and optical crosstalk in photodiodes.

Figure 6A:
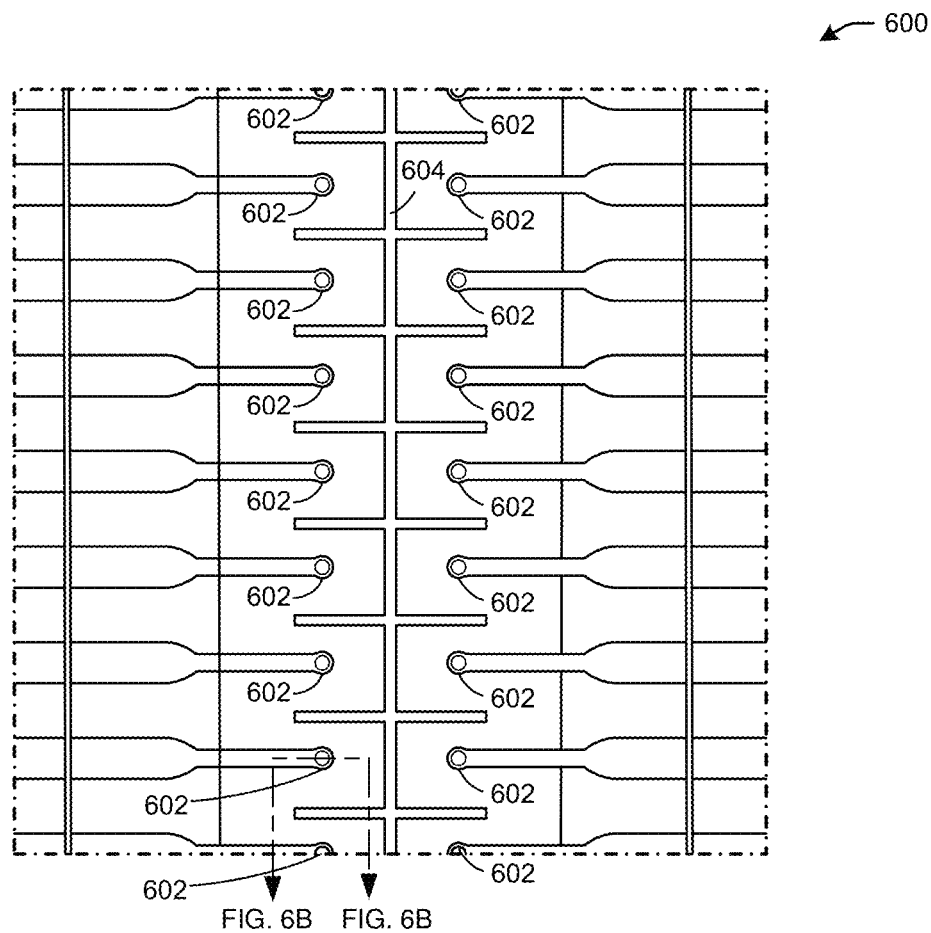
FIG. 6A illustrates an example top view of a photodiode array, in accordance with one or more example embodiments of the present disclosure.

FIG. 6A illustrates an example top view of a photodiode array 600, in accordance with one or more example embodiments of the present disclosure.

Referring to FIG. 6A, the photodiode array 600 may include traces 602 (e.g., metal traces) and one or more trenches 604 (e.g., indentions), which may be dry-etched or otherwise fabricated. The traces 602 may include conductive material (e.g., copper or otherwise) that allow for the flow of electricity. The one or more trenches 604 may prevent optical crosstalk as well as diffusive crosstalk. The photodiode array 600 may be an APD or other type of photodiode.

Figure 6B:
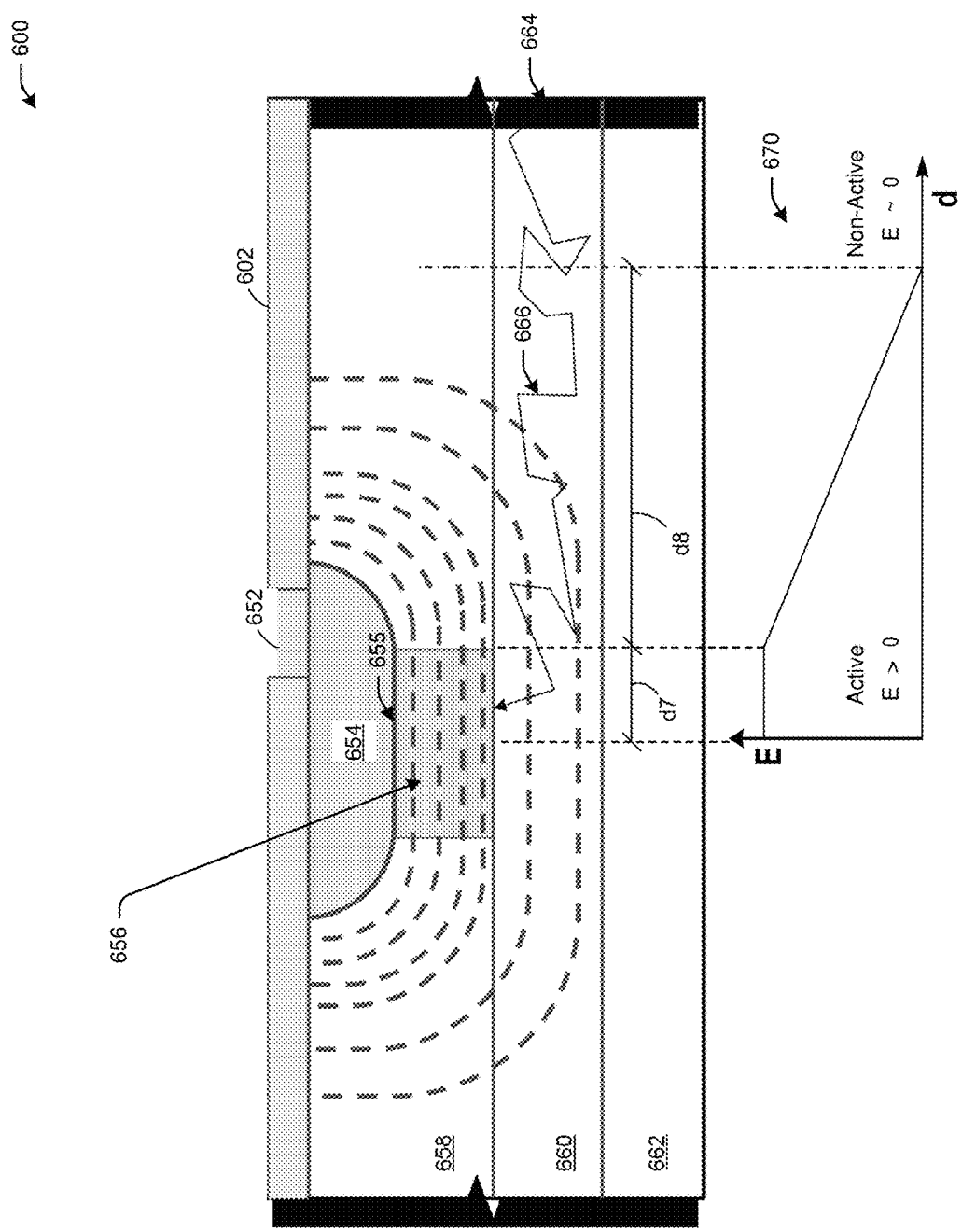
FIG. 6B illustrates an example side cross-section view of the photodiode array of FIG. 6A, in accordance with one or more example embodiments of the present disclosure.

FIG. 6B illustrates an example side cross-section view of the photodiode array 600 of FIG. 6A, in accordance with one or more example embodiments of the present disclosure.

Referring to FIG. 6B, the photodiode array 600 may include an anode 652 (e.g., a charged electrode in one of the traces 602, through which bias voltage is applied from the outside) at least partially covering a portion a diffused region 654 (e.g., a degenerately doped region where the electric field strength is zero except within a proximity, such as around 100 nanometers, of a p-n junction 655). The diffused region 654 may include the p-n junction 655 (e.g., a buried p-n junction). The diffused region 654 may extend at least partially into a cap layer 658 (e.g., an i-InP cap, or another material). Avalanching may occur within the cap layer 658 (e.g., at a portion 656 of the cap layer 658 proximal enough to the diffused region 654, where the electric field strength may be strong enough to give rise to avalanche gain). The portion 656 of the cap layer 658 may be referred to as an avalanche region. Below the cap layer 658 may be an absorber layer 660 (e.g., an I-InGaAS absorber material or another material), and below the absorber layer 660 may be a buffer layer 662 (e.g., an n+-InP material or another material). An electrical carrier 664 created by photon absorption in the absorber layer 660 may diffuse along a path 666. The electrical carrier 664 may diffuse to the avalanche region 656 (e.g., diffusive crosstalk).

In one or more embodiments, crosstalk can be particularly troubling in applications with fast time constants. An InGaAs absorber material (e.g., used in the absorber layer 660), for example, may allow for long carrier diffusion lengths and lifetimes (e.g., diffusion lengths of ~50-200 lifetimes from ~1-100 µs). Because carriers (e.g., the electrical carrier 664) may be long-lived and may diffuse quite far, carriers may migrate from long distances outside the avalanche region 656 to be collected and trigger dark counts at 100s of nanoseconds or even microseconds later, giving rise to false detection events much later than the time corresponding to true signal photon arrivals.

In one or more embodiments, at least some of the absorber layer 660 may be removed (e.g., etched away) in order to mitigate diffusive crosstalk. The absorber layer 660 that may be at least partially removed from the photodiode array 600 may include the one or more trenches 604 of FIG. 6A. The optimized amount of the absorber layer 660 removed may answer a question of how far into or how close to the active region to etch in order to both optimize passivation and minimize crosstalk. The distance from the avalanche region 656 at which the absorber layer 660 may be etched may be dependent on the electric field strength at the distance, and based on any need to passivate any material that remains after etching. For example, FIG. 1A represents complete removal of the non-active portion of the absorber layer 660 (e.g., corresponding to the non-active material 102), exposing the buffer layer 662 (e.g., corresponding to the buffer layer 108) below. FIG. 1B represents partial removal of the non-active portion of the absorber layer 660, leaving some of the absorber layer 660 (e.g., corresponding to the non-active material 102), and exposing some of the buffer layer 662 (e.g., corresponding to the buffer layer 108) below. The lateral distance from the avalanche region 656 to the buffer layer 662 may be based on the electric field strength at the edges of the unetched material at the closest location of the exposed buffer layer 662 to the avalanche region 656 due to the at least partial removal of the absorber layer 660. The buried p-n junction 655 may be passivated electrically, but electric field intensity extending laterally from the p-n junction 655 may require leaving some of the absorber layer 660, which may result in crosstalk as represented by the path 666 of the electrical carrier 664. Therefore, the photodiode array 600 may benefit from removing some of the active portion of the absorber layer, but not so much that the exposed surfaces experience an electric field intensity that it too large to passivate.

As shown by graph 670, the electric field strength E within the avalanche region is non-zero, and outside the avalanche region may be non-zero, but declining toward zero as the lateral distance from the p-n junction 655 approaches the distance d8.

Figure 6C:
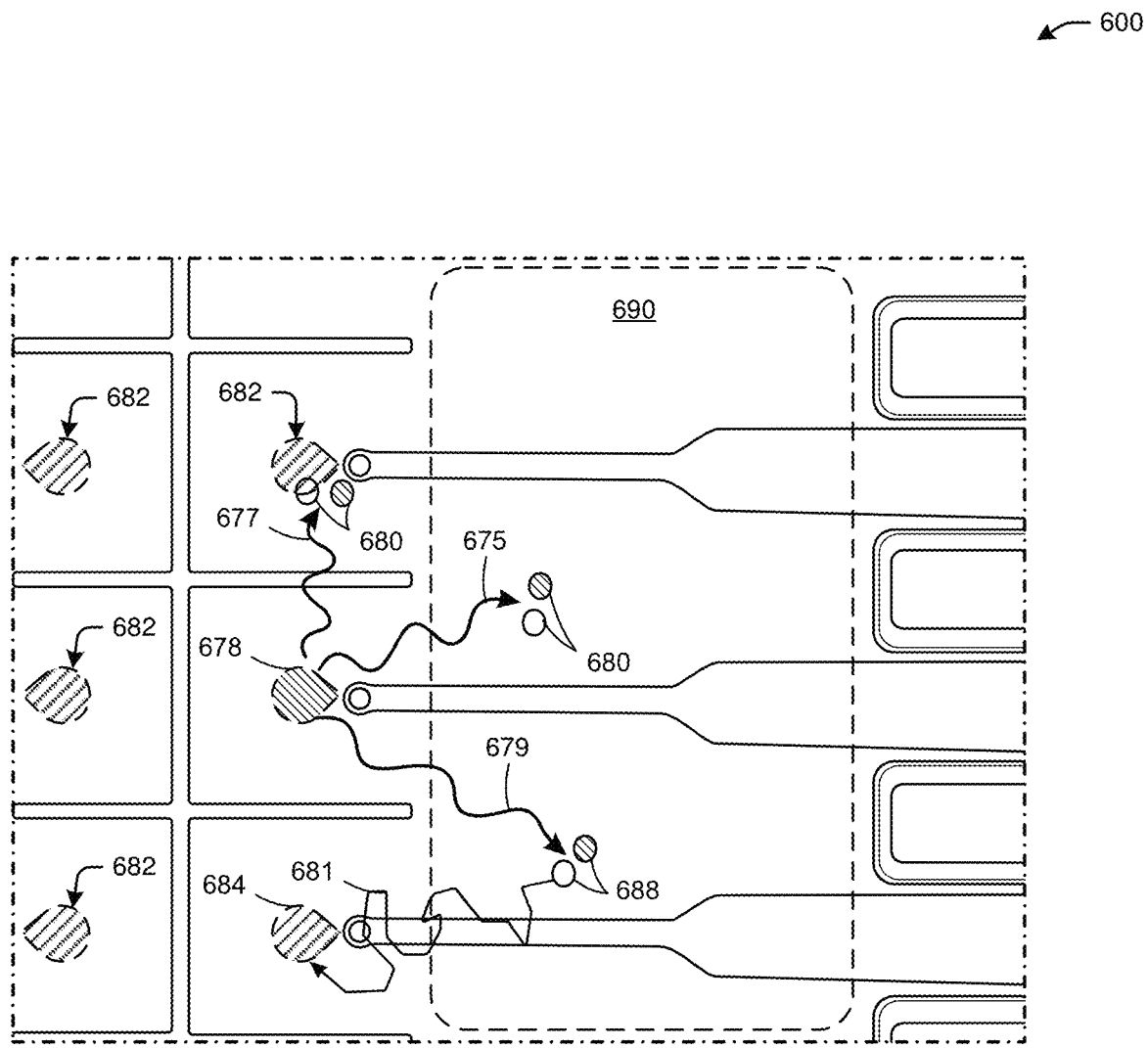
FIG. 6C illustrates example avalanching pixels of the photodiode array of FIG. 6A, in accordance with one or more example embodiments of the present disclosure.

FIG. 6C illustrates example avalanching pixels of the photodiode array 600 of FIG. 6A, in accordance with one or more example embodiments of the present disclosure.

Referring to FIG. 6C, the top view of the photodiode array 600 of FIG. 6A is shown in more detail with both optical crosstalk and diffusive crosstalk. Photons (e.g., photon 675, photon 677, photon 679) may be emitted by an avalanche (e.g., of an avalanching pixel 678) may result in electrical carriers 680 created by photon absorption. The result may be optical crosstalk at one or more pixels 682 (e.g., carrier generation within the active regions of individual pixels). The avalanching pixel 678 may represent an initial avalanching pixel that may generate electrical carriers 688, which may follow a path 681 to induce a subsequent avalanche at pixel 684—a manifestation of diffusive crosstalk in which the pixel 684 may collect the electrical carriers 688). In a region 690 where photon absorption may create diffusion carriers, diffusive crosstalk may occur as the electrical carriers 688 diffuse along the path 681. In this manner, the avalanche at the pixel 678 may result in secondary avalanches at the pixel 684. In one or more embodiments, to reduce such optical and diffusive crosstalk, the photodiode array 600 may benefit from removal of at least some of the absorber layer 660 of FIG. 6B as described above.

In one or more embodiments, the buried p-n junction 655 of FIG. 6B may be used in the photodiode array 600, such as in APDs. Free electrical carriers (e.g., the electrical carrier 664) may be generated in the absorber layer 660 of the APD and injected into the avalanche region 656 of the APD. The absorber layer 660 may absorb energy from light to generate free charge carriers. The avalanche region 656 may be a region of the APD in which the free charge carriers multiply to generate detectable electrical current. The free carriers may accelerate in the avalanche region 656, allowing them to create additional free carriers (e.g., a process referred to as "impact ionization"), and the additional free carriers also may accelerate (e.g., due to the electric field presence) to create more free carriers. This multiplication of free carriers may be referred to as avalanche multiplication. When light enters the photodiode array 600, electron-hole pairs may be generated when the energy from the light exceeds a band gap energy. An electric field may cause the electrons (e.g., the electrical carrier 664 of FIG. 6B) to drift to the substrate, and the holes (e.g., electron holes) to drift to the p-type material of the p-n junction 655. The stronger the electric field, the more drift of the electrons and holes.

FIG. 7A illustrates an example top view of a photodiode array 700, in accordance with one or more example embodiments of the present disclosure.

Figure 7:
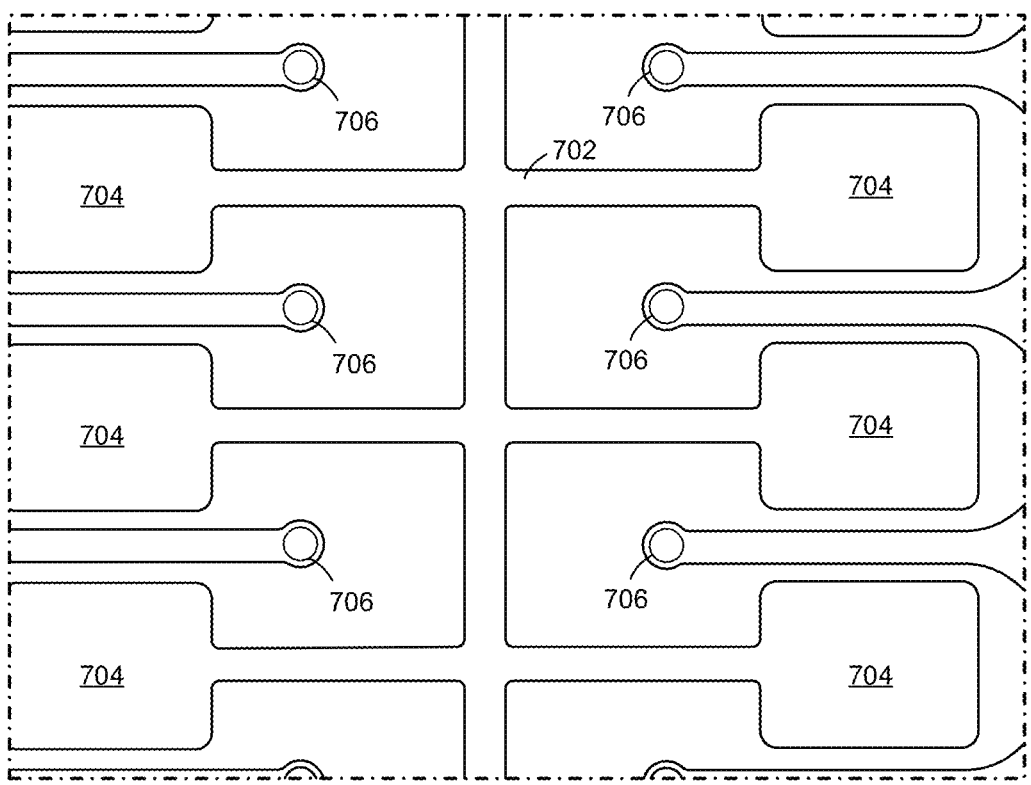
FIG. 7 illustrates an example top view of a photodiode array, in accordance with one or more example embodiments of the present disclosure.

Referring to FIG. 7, the photodiode array 700 may be similar to the photodiode array 600 of FIG. 6A. For example, the photodiode array 700 may include one or more trenches 702 (e.g., similar to the one or more trenches 604 of FIG. 6A), and pits 704 (e.g., removed portions down to the buffer layer 662 of FIG. 6B), and traces 706. The part of the absorber layer 660 of FIG. 6B that may be removed from the photodiode array 600 (or the photodiode array 700) may include any of the one or more trenches 702, and any of the pits 704.

In one or more embodiments, material around the traces 706 may be etched away or otherwise removed to generate the mesa structure as shown in FIG. 8. The etching or other removal of material may generate the one or more trenches 702 and/or the pits 704.

FIG. 8 illustrates an example side cross-section view of the portion 170 of photodiode structures of FIG. 1C, in accordance with one or more example embodiments of the present disclosure.

Referring to FIG. 8, the portion 170 represented by the cross-section view may include the contact point 182 of FIG. 1C, at least partially disposed over a portion of the diffused region 188. The diffused region 188 may include a p-n junction 805 (e.g., a buried p-n junction such as the p-n junction 655 of FIG. 6B). Below the diffused region 188 may be an avalanche region 806 (e.g., similar to the avalanche region 656 of FIG. 6B). The diffused region 188 may at least partially extend into a cap layer 808 (e.g., similar to the cap layer 658 of FIG. 6B). Below the cap layer 808 may be an absorber layer 810 (e.g., similar to the absorber layer 660 of FIG. 6B), and below the absorber layer 810 may be a buffer layer 812 (e.g., similar to the buffer layer 662 of FIG. 6B). The trench 198 may extend (e.g., via etching) to the buffer layer 812 (e.g., through the cap layer 808 and through the absorber layer 810). The trench 198 may be formed by etching away at least some of the cap layer 808 and the absorber layer 810. The distance d1 from the avalanche region 806 at which the trench 198 is etched may be determined by the presence of the electrical field at the distance d1. The greater the distance d1, the less electrical passivation may be required for any remaining material between the avalanche region 806 and the trench 198, and the easier the fabrication of the portion 170 may be as a result, but the more noise from crosstalk may be present (e.g., as explained with respect to FIG. 6C). The smaller the distance d1, the greater the likelihood of a non-zero electrical field presence that may require electrical passivation, resulting in a more difficult fabrication. In this manner, the distance d1 may be selected to reduce crosstalk while also minimizing the need for electrical passivation.

In one or more embodiments, the buried p-n junction 805 may be used in a photodiode array, such as in APDs. Free electrical carriers (e.g., the electrical carrier 664 of FIG. 6B) may be generated in the absorber layer 810 of the APD and injected into the avalanche region 806 of the APD. The absorber layer 810 may absorb energy from light to generate free charge carriers. The avalanche region 806 may be a region of the APD in which the free charge carriers multiply to generate detectable electrical current. The free carriers may accelerate in the avalanche region 806, allowing them to create additional free carriers (e.g., a process referred to as "impact ionization"), and the additional free carriers also may accelerate (e.g., due to the electric field presence) to create more free carriers. This multiplication of free carriers may be referred to as avalanche multiplication. When light enters the portion 170, electron-hole pairs may be generated when the energy from the light exceeds a band gap energy. An electric field may cause the electrons (e.g., the electrical carrier 664 of FIG. 6B) to drift to the buffer layer 812, and the holes (e.g., electron holes) to drift to the p-type material of the p-n junction 805. The stronger the electric field, the more drift of the electrons and holes.

Referring to FIG. 6B and FIG. 8, the diffused region 654 and the diffused region 188 may form a mesa structure with the buried p-n junction 655 and the buried p-n junction 805, respectively (e.g., the plateau 194 of FIG. 1C). The removal of the absorber layer 660 and the absorber layer 810 may mitigate crosstalk while maintaining high-quality passivation. For example, the more material etched away, the more crosstalk may be reduced, but the removal of absorber material may result in the remaining absorber material having a non-zero electric field or being in close proximity to remaining absorber material having a non-zero electric field, thereby necessitating passivation. The surface electric field intensities may be reduced and may be tuned by adjusting the distance between the active absorber material and the removed absorber material. Removal of non-active material (e.g., the cap layer 658, the absorber layer 660, the cap layer 808, the absorber layer 810) may be achieved using geometric configurations such as trenches, pits, end caps, wells, and troughs (e.g., the trench 198), and may allow for a significant reduction in the dark count rate (e.g., the average rate of counts without incident light) when compared to some existing photodiodes. The diffused region 654 and the diffused region 188 may be formed by etching away at least a portion of the surrounding material(s) to form a mesa structure with non-planar passivation, and the diffused region 654 and the diffused region 188 may be formed by dopant diffusion to create the buried p-n junction 655 and the buried p-n junction 805, respectively, with planar passivation. To optimize passivation by avoiding a need to passivate material with a high electric field, at least some non-active material around the active p-n junction may be removed by etching. Etching further away from the p-n junction and leaving more absorber material may result in significant crosstalk, but etching closer to the p-n junction and leaving less (if any) absorber material may result in a need to passivate material having significant electric field strength (e.g., as shown in FIGS. 2-4). Therefore, the hybrid use of a mesa structure and a buried p-n junction may balance a goal of reducing crosstalk by etching non-active material with a goal of avoiding a need to passivate materials with a significant electric field.

Figure 9:
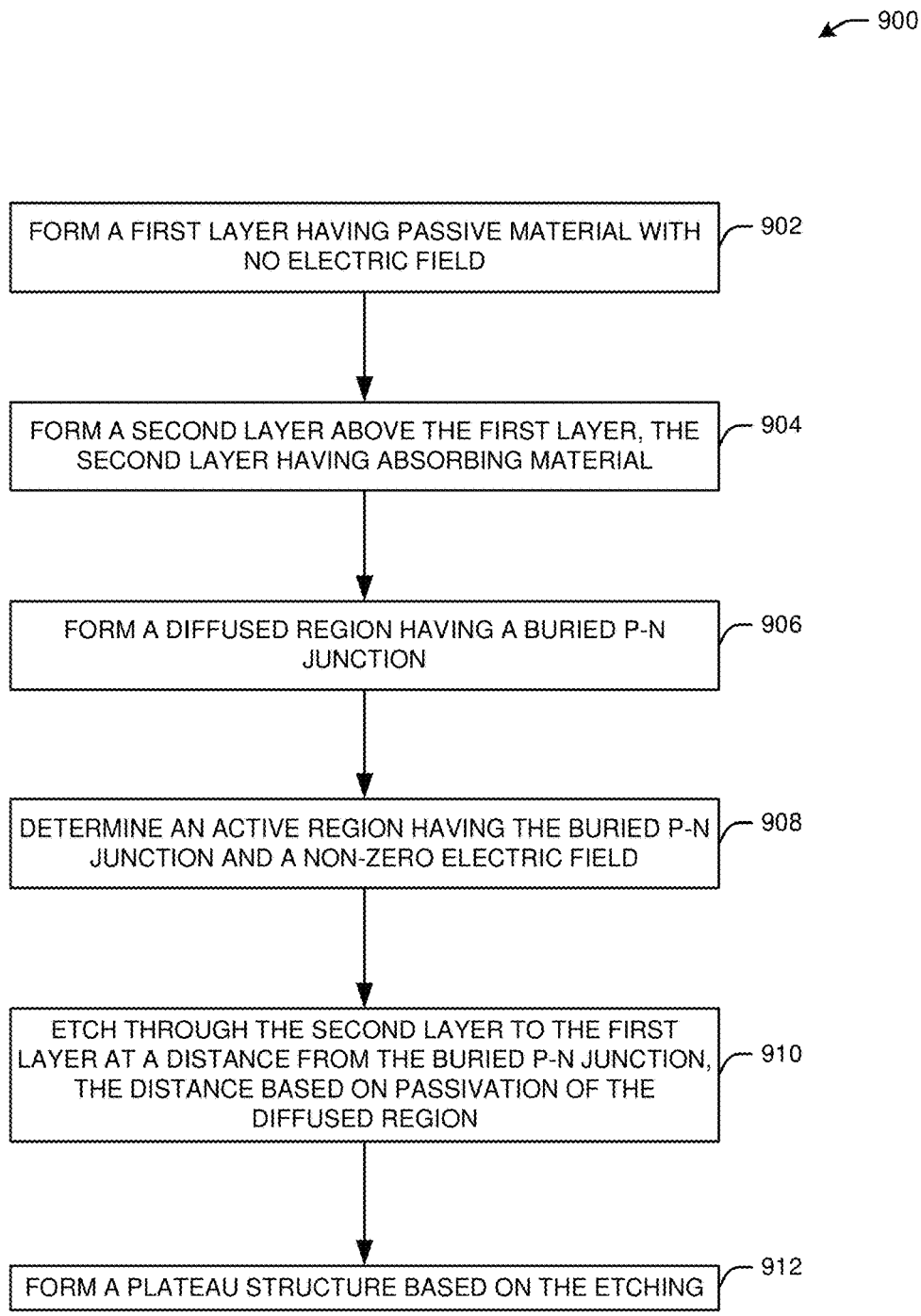
FIG. 9 illustrates a flow diagram for a process for forming a photodiode, in accordance with one or more example embodiments of the present disclosure.

FIG. 9 illustrates a flow diagram for a process 900 for forming a photodiode, in accordance with one or more example embodiments of the present disclosure.

At block 902, a first layer for a photodiode may be formed, the first layer having passive material with no electrical field. For example, the first layer may include a buffer layer (e.g., the buffer layer 108 of FIG. 1A, the buffer layer 108 of FIG. 1B, the buffer layer 662 of FIG. 6B, the buffer layer 812 of FIG. 8). The first layer may include an n+-InP material or another material on which one or more additional layers may be arranged.

At block 904, a second layer for the photodiode may be formed (e.g., the non-active material 102 of FIG. 1A and FIG. 1B) above the first layer, the second layer having absorber material. The second layer may include a non-active absorber layer (e.g., the absorber layer 660 of FIG. 6B, the absorber layer 810 of FIG. 8). When the photodiode is a homojunction p-n photodiode (e.g., the homojunction p-n photodiode 200 of FIG. 2), the second layer may include a non-active absorber layer (e.g., the n-absorber layer 204 of FIG. 2). When the photodiode is a heterojunction p-i-n photodiode (e.g., the heterojunction p-i-n photodiode 300 of FIG. 3), the second layer may include an n− absorption layer (e.g., the n− absorption layer 306 of FIG. 3). When the photodiode is a heterojunction APD (e.g., the heterojunction APD 400 of FIG. 4), the second layer may include an n− absorption layer (e.g., the n– absorption layer 406 of FIG. 4). An electric field strength in the second layer may depend on a distance from a location of the second layer to an active region formed at block 906.

At block 906, a diffused region having a buried p-n junction for the photodiode may be formed. The diffused region may be in the form of a mesa in which a portion of the diffused region is above at least a portion of at least one of the first layer or the second layer. The diffused region may include an active region and the second layer. For example, referring to FIG. 2, the p-diffused region 202 may be at least partially positioned within the n-absorber layer 204. Referring to FIG. 3, the p$^+$ diffused region 302 may be positioned at least partially within the n$^-$ cap layer 304 and then absorption layer 306. Referring to FIG. 4, the p$^+$ diffused region 402 may be at least partially positioned within the cap layer 404, and the cap layer 404 may be positioned above the n$^-$ absorption layer 406. Referring to FIG. 6B, the diffused region 654 may include the buried p-n junction 655 within the cap layer 658, above the absorber layer 660. Referring to FIG. 8, the diffused region 188 may include the buried p-n junction 805 within the cap layer 808, above the absorber layer 810. Within the diffused region, the electric field strength may be non-zero. The electric field strength of the second layer may be zero or non-zero depending on the distance from the diffused region to the second layer (see FIGS. 2-4 and the respective electric field graphs, for example).

At block 908, an active region for the photodiode may be determined. The active region may refer to a region in which the electrical field strength is non-zero, and the active region may include the buried p-n junction and may include surrounding material where the electric field is present.

At block 910, the photodiode may be etched through the second layer to the first layer (e.g., the trench 198 of FIG. 1 and FIG. 8). The distance (e.g., the distance d1 of FIG. 8) from the diffused region at which the photodiode is etched to remove at least some of the second layer may be determined in a manner that reduces crosstalk and the need for electrical passivation. For example, rather than etching away all of the non-active second layer around the diffused region, passivation may be achieved by leaving some of the second layer, but not so much of the second layer that significant crosstalk results. The optimized amount of etching may answer a question of how far into or how close to the diffused region to etch in order to minimize both passivation and crosstalk. The distance from the diffused region at which the second layer may be etched may be dependent on the electric field strength at the distance, and based on any need to passivate any material that remains after etching.

At block 912, the etching of the second layer may form a plateau (or mesa) structure in which at least a portion of the diffused region is at least partially above at least a portion of the first layer and/or the second layer. As shown in FIG. 8, etching the trench 198 may result in at least a portion of the absorber layer 810 and the buffer layer 812 below the diffused region 188. The top views of FIG. 1A and FIG. 1B show the active material 104 above the buffer layer 108 (e.g., the active material 104 coming out of the page more than the buffer layer 108) in the form of a plateau or mesa. The plateau or mesa formed by etching may be a result of removed non-active material that, when not removed, may contribute to electrical and optical crosstalk in the photodiode. The plateau or mesa may be formed by removing enough material around the diffused region to reduce crosstalk, and may allow for some material around the diffused region to remain as long as the electrical field strength within the remaining material around the diffused region is less than a threshold electrical field strength so as to avoid difficult electrical passivation of the remaining material around the diffused region.

The descriptions of the figures are not meant to be limiting.

In one or more embodiments, a method for forming a photodiode may include: forming a first layer comprising passive material, the passive material having no electric field; forming a second layer comprising an absorbing material, the second layer above the first layer; forming a diffused region comprising a buried p-n junction; determining an active region comprising the buried p-n junction and having an electric field greater than zero; etching through the second layer to the first layer, the etching performed at a distance of fifteen microns or less from the buried p-n junction (or another distance); and forming a plateau structure based on the etching. At the distance, an electric field of the second layer is zero or non-zero. The photodiode may be an APD. The distance may be determined based on a passivation associated with the photodiode and/or based on the electric field of the active region. The method may include forming a third layer above the second layer, wherein the buried p-n junction is disposed in the second layer and in the third layer. The etching may be from the third layer to the first layer. The method may include forming a third layer above the second layer, wherein the buried p-n junction is disposed in the third layer and is above the second layer.

In one or more embodiments, a photodiode may include a first layer with passive material, the passive material having no electric field. The photodiode may include a second layer with an absorbing material, the second layer above the first layer. The photodiode may include a diffused region with a buried p-n junction. The photodiode may include an active region with the buried p-n junction and having an electric field greater than zero. The photodiode may include a plateau structure based on etching through the second layer to the first layer, the etching performed at a distance of fifteen microns or less from the buried p-n junction. At the distance, an electric field of the second layer is zero or non-zero. The photodiode may be an APD. The distance may be determined based on a passivation associated with the photodiode and/or based on the electric field of the active region. The photodiode may include a third layer above the second layer, wherein the buried p-n junction is disposed in the second layer and in the third layer. The etching may be from the third layer to the first layer. The photodiode may include a third layer above the second layer, wherein the buried p-n junction is disposed in the third layer and is above the second layer.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

It is understood that the above descriptions are for purposes of illustration and are not meant to be limiting.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component.

Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. An avalanche photodiode, comprising:
    a first layer comprising passive material, the passive material having no electric field;
    a second layer comprising an absorbing material, the second layer on the first layer;
    an active region comprising a buried p-n junction and at least a first portion of the second layer, and the active region having an electric field greater than zero; and
    a plateau structure based on an absence of a second portion of the second layer, the absence of the second portion of the second layer being a distance greater than zero from the buried p-n junction.

2. The avalanche photodiode of claim 1, further comprising a third layer on the second layer, wherein the buried p-n junction is disposed in the third layer.

3. The avalanche photodiode of claim 2, wherein the absence of the second portion of the second layer is based on a removal of the second portion of the second layer at the distance, and wherein the removal is based on etching from the third layer to the first layer.

4. The avalanche photodiode of claim 1, wherein the absence of the second portion of the second layer is based on a removal of the second portion of the second layer at the distance, the distance being fifteen microns or less from the buried p-n junction.

5. The avalanche photodiode of claim 1, wherein at the distance, the electric field in the second layer is either zero or not zero.

6. The avalanche photodiode of claim 1 wherein an amount of crosstalk between at least two pixels of the avalanche photodiode is based on a selection of the distance.

7. The avalanche photodiode of claim 1 wherein the distance is based on an amount of passivation associated with the avalanche photodiode.

8. The avalanche photodiode of claim 1, wherein the distance is based on a strength of the electric field of the active region.

9. The avalanche photodiode of claim 1, wherein the absence of the second portion of the second layer is based on a removal of the second portion of the second layer at the distance, and wherein the removal is based on etching from a third layer to the first layer.

10. An avalanche photodiode, comprising:
    a first layer comprising passive material, the passive material having no electric field;
    a second layer comprising an absorbing material, the second layer on the first layer;
    a third layer on the second layer;
    an active region comprising a buried p-n junction and having an electric field greater than zero, the active region comprising at least a first portion of the second layer and at least a first portion of the third layer; and
    a plateau structure based on a first absence of a second portion of the second layer and a second absence of a second portion of the third layer, the first absence and the second absence at a distance greater than zero from the buried p-n junction.

11. The avalanche photodiode of claim 10, wherein the first absence and the second absence are based on a removal of the second portion of the second layer and the second portion of the third layer at the distance, the distance being fifteen microns or less from the buried p-n junction.

12. The avalanche photodiode of claim 10, wherein at the distance, the electric field in the second layer is either zero or not zero.

13. The avalanche photodiode of claim 10, wherein an amount of crosstalk between at least two pixels of the avalanche photodiode is based on a selection of the distance.

14. The avalanche photodiode of claim 10 wherein the distance is based on an amount of passivation associated with the avalanche photodiode.

15. The avalanche photodiode of claim 10, wherein the distance is based on a strength of the electric field of the active region.

16. A method for forming a photodiode, comprising:
    forming a first layer comprising passive material, the passive material having no electric field;
    forming a second layer comprising an absorbing material, the second layer on the first layer;
    forming a diffused region comprising a buried p-n junction;
    forming an active region comprising the buried p-n junction and having an electric field greater than zero; and
    forming a plateau structure based on removal of a portion of the second layer to the first layer, the removal performed at a distance from the buried p-n junction.

17. The method of claim 16, wherein at the distance, the electric field in the second layer is either zero or not zero.

18. The method of claim 16, wherein an amount of crosstalk between at least two photodiode pixels is based on a selection of the distance.

* * * * *